Sept. 19, 1967 TING LI CHU 3,342,619

METHOD FOR GROWING GERMANIA FILMS

Filed April 16, 1964

WITNESSES:

John G. Chopp

James F. Young

INVENTOR

Ting Li Chu

BY Gordon H. Telfer

ATTORNEY 3,342,619

METHOD FOR GROWING GERMANIA FILMS

Ting Li Chu, Pittsburgh, Pa., assignor to Westinghouse Electric Corporation, East Pittsburgh, Pa., a corporation of Pennsylvania Filed Apr. 16, 1964, Ser. No. 360,266
8 Claims. (Cl. 117—201)

Figure 1:
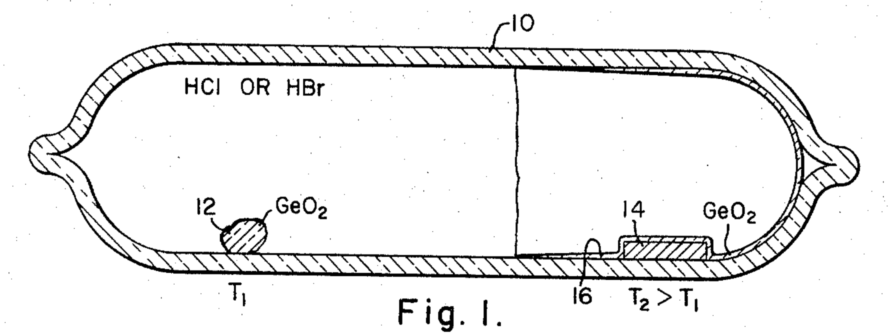

This invention relates to growing germania, $GeO_2$, in dense films or layers and particularly to growing such films for use in semiconductor technology.

The use of films of silica, $SiO_2$, in semiconductor technology is well known. Films of silica provide passivation of p-n junctions, masks for the diffusion of impurities and sources of diffused impurities. On silicon semiconductor devices, silica films may conveniently be formed by thermal oxidation as well as other known methods. Films of germania, on the other hand, have not been used for device fabrication due to the difficulty of growing such films. For example, thermal oxidation of germanium is not suitable for the formation of germania since germania reacts with the bulk germanium at temperatures above 700° C. according to the equation $$Ge+GeO_2=2GeO$$

with the product being a gas.

It has been recognized that a layer of germania could be provided on a substarate by immersing the substrate in molten germania. However, this procedure requires that the germania be at a temperature of over 1100° C. which is an undesirably high temperature to subject a semiconductor body.

In copending application Ser. No. 340,529, now U.S. Patent No. 3,287,162, filed Jan. 27, 1964, by T. L. Chu and J. R. Gavaler and assigned to the same assignee as the present invention, there is disclosed a method of forming films of silica by a vapor transport reaction utilizing hydrogen fluoride gas as the transport agent. Satisfactory results have been obtained in the growth of silica by such technique. The same technique is not suitable for the growth of germania, apparently because of the unfavorable chemical equilibrium of the reaction between germania and hydrogen fluoride at reasonable temperatures.

It is therefore an object of the present invention to provide a method for the formation of a germania film on a substrate surface.

Another object is to provide a method for the formation of a germania film that may be performed at moderate temperatures (below about 700° C.).

Another object is to provide an improved method of forming a dielectric layer of germania on the surface of the semiconductive substrate that is suitable for junction passivation, diffusion masking and may have a suitable impurity incorporated therein to provide a diffusion source.

The invention, in brief, achieves the above-mentioned and additional objects and advantages thereof by providing a method that generally comprises the steps of heating a germania source at a first temperature, in an atmosphere containing at least one member of the group consisting of hydrogen chloride and hydrogen bromide while heating a substrate at a second temperature greater than that of said first temperature to cause gaseous products from said germania source to be transported to said substrate and to recombine to form a germania film thereon.

The present invention utilizes the reversibility of the reaction of germania with either hydrogen chloride or hydrogen bromide to form the germania film. For example, germania reacts reversibly with hydrogen chloride according to the equation:

$$GeO_2(solid)+4HCl\ (gas)=GeCl_4\ (gas)+2H_2O\ (gas)$$

This reaction proceeds to the right at a lesser extent with increasing temperature and hence if the germania source is at a lower temperature than the substrate there is transport of germania from the source to the substrate by hydrogen chloride.

Figure 2:
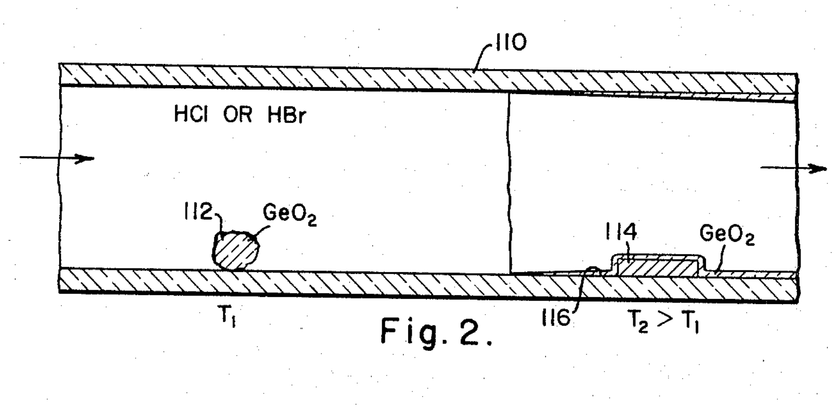

The invention, together with the above-mentioned and further objects and advantages thereof, will be better understood by reference to the following description together with the accompanying drawing, wherein:

FIGURES 1 and 2 are sectional views of apparatus arrangements suitable for use in the practice of this invention.

The germania material used as the source in the practice of this invention may be derived by known techniques such as in accordance with the following reactions:

$$Ge+2Cl_2=GeCl_4$$

and $$GeCl_4+2H_2O=GeO_2+4HCl$$

The germania may be employed in powdered form or it may be fused as is sometimes desired for easier handling.

The germania source need not have any critical degree of purity. Any impurities that may be present should be non-reactive with the vapor transport agent in any manner that would impede the transport of the germania. The non-reactive impurities will remain in the source and, hence, the transported germania may be purer than the source material. The substrate on which films of germania may be grown in accordance with this invention may be selected from any of those materials which, at the temperatures at which the transport growth is performed, are compatible with the hydrogen halide atmosphere. Semiconductors, metals and insulators are generally suitable and no particular degree of crystallinity of the substrate is required.

The atmosphere should contain either hydrogen chloride or hydrogen bromide in a sufficient quantity so that the rate of the reaction is suitably great. Either one or both of the mentioned gases may be employed in the atmosphere. Air or other impurities present in the atmosphere will not prevent the reaction from going forward but will have a tendency to retard the rate of reaction. It is generally satisfactory to employ the gas transport agent in a partial pressure within the range from about ½ atmosphere to about 10 atmospheres.

Within the chamber in which the source, substrate and transport agent are disposed there must exist a temperature gradient between the source and substrate such that the substrate is at a higher temperature than the source. This condition is required inasmuch as the equilibrium constants for the reaction of germania and hydrogen chloride or hydrogen bromide decrease with increasing temperature and hence for transport of germania to be effective the substrate must be at a higher temperature than the source. This temperature gradient can be provided by placing the chamber in which the source, substrate and transport gas are disposed within a furnace having two independently controlled zones.

The magnitude of the temperature difference between the source and substrate is not critical. The transport process occurs at a more rapid rate the greater the temperature gradient is. There are some practical limits on the temperatures that may be employed. For example, the source temperature must be at least 100° C. because one of the reaction products of the germanium and hydrogen halide is water vapor which should be transported to the substrate so that the reverse reaction may proceed. This requires the source temperature to be at least 100° C. so that water vapor does not condense thereon. As mentioned in the introduction, germania reacts with elemental germanium at temperatures above about 700° C. to form a gaseous product and hence, at least in those instances in which the substrate is of germanium, the temperature thereof should be less than about 700° C. Of course, it is desirable to avoid high temperatures as much as possible. Generally suitable conditions are those where the source is at a temperature from about 100° C. to about 300° C. and the substrate is at a temperature from about 350° C. to about 700° C. More preferred are source temperatures in the range from about 100° C. to about 200° C. and substrate temperatures in the range from about 400° C. to about 500° C.

In any practical arrangement of apparatus for the practice of this invention it will of course be found that the greater the temperature differential that is desired between the source and substrate, the greater the distance between the two is required and thus the gain in reaction rate provided by a large temperature gradient is offset by the spacing. Consequently, a compromise in this respect must also be provided and it has been found that a spacing between a source and substrate within the range from about three inches to about five inches is satisfactory for performing this process within readily available furnaces.

In general, there are two arrangements of apparatus in which the method in accordance with this invention may be performed. One is that using a closed chamber containing the source, substrate and transport agent and the other is that of using an open chamber wherein the transport media is continuously supplied and exhausted from the region in which the source and substrate are disposed.

FIGURE 1 illustrates the practice of the invention in a closed chamber. The chamber may conveniently be a sealed off tube 10 of high temperature glass such as fused silica. The source 12 and substrate 14 are placed in the tube 10. The tube 10 is then evacuated by drawing on a vacuum pump to a pressure at least as low as bout $10^{-5}$ Torr and then a controlled quantity of the desired atmosphere, HCl, HBr or a mixture of both, is supplied and the tube sealed off. It is then inserted into a furnace, not shown, having two independently controlled temperature zones so that the source 12 is maintained at a temperature $T_1$ and the substrate 14 is maintained at a temperature $T_2$ greater than $T_1$.

Under these conditions the reaction before described is carried out and a film of germania 16 is formed on the substrate 14. Since the wall of the silica tube in the vicinity of the substrate 14 is also a suitable substrate for the deposition of germania, the film 16 will extend over the inside of the wall. However, this does not interfere with the formation of the germania film 16 on the substrate 14 itself.

FIGURE 2 shows the general configuration for utilizing the method in accordance with this invention in an open tube. The tube 110, of a suitable refractory material such as fused silica, has a source 112 and a substrate 114 disposed therein that are maintained by a furnace, not shown, with the source 112 at a temperature $T_1$ and substrate 114 at a temperature $T_2$ greater than $T_1$. Within the open end of the tube adjacent the source 112 is supplied a transport agent, HCl, HBr or a mixture of both. Conveniently, the process may be performed with the transport agent supplied at a pressure of about one atmosphere.

The reaction above-described is carried out and a film of germania 116 is formed over the substrate 114 and the adjacent wall of the tube 110. The reformed transport agent is then exhausted from the end of the tube adjacent the substrate. It is apparent that the practice of the invention with the open tube configuration may be more convenient where a large number of substrates are to be simultaneously deposited with germania and when it is desired to avoid the necessity of evacuation and seal off required with the closed tube operation.

The resulting germania film grown by the method of this invention is dense and adheres well to substrates without any special treatment of the surface thereof. Analysis has shown the germania film may include elements from the transport agent and the tube wall in a quantity up to about 15 atomic percent. Such impurities do not seriously detract from the good dielectric properties of the film.

Among the applications for germania films formed in accordance with this invention, those in semiconductor technology are of considerable immediate interest. The germania films provide a possible alternative to the use of silica for surface passivation, diffusion masking and as a diffusion source. Semiconductive substrates such as those of germanium, silicon and III–V compounds such as gallium arsenide may have films of germanium formed thereon in accordance with the present invention. Such substrates, under the temperature conditions set forth herein are quite compatible with the HCl or HBr atmosphere. Other applications exist such as providing films of germania for use as the dielectric in capacitors such as thin film capacitors in microelectronic devices. Other applications will be apparent those skilled in the art.

Following are described in greater detail examples of the practice of the present invention.

The transport of germania by hydrogen chloride was carried out in clear fused silica tubes of 25 millimeters inside diameter, using alpha-quartz plates as substrates. The substrates were of AT cut (35° 15′ from the XZ plane) and Z cut (parallel to the basal plane), and were approximately 12 x 12 x 0.5 millimeters in size. They were cut from synthetic quartz crystals, mechanically lapped, followed by polishing with American Optical Co. No. 309 Red Polishing Rouge. The damaged layer in AT and Z cut substrates resulting from the polishing operation was approximately 1 micron in thickness and was removed by etching in 49% hydrofluoric acid for 15 minutes. The source material was glassy germania obtained by fusing germanium oxide powder of 99.99% purity obtained from Eagle-Picher Company in a quartz ampoule. The transport agent was anhydrous hydrogen chloride of 99.5% purity obtained from The Matheson Company, Inc., and the non-condensable impurities were removed by refrigerating hydrogen chloride with liquid nitrogen followed by evacuation.

The reaction tube containing the substrate and gemania source was attached to a vacuum manifold, evacuated to $10^{-5}$ Torr or less, and a pre-measured amount of hydrogen chloride distilled in. This tube was then sealed and placed in a tube furnace containing two independently-controlled temperature zones. The substrate was placed in the high temperature zone which was maintained at temperatures below the alpha-beta transition point of quartz, 573° C., typically at about 500° C. The source germania was kept at 50° C. to 300° C. below the temperature of the substrate, typically at about 200° C. The experiments were performed for durations up to several days.

The specimens of germania deposited on the quartz substrates were examined by optical microscope and electron and X-ray diffraction techniques. Both the as-grown surface and chemically etched surface of the specimen were studied. They were found to be homogeneous, essentially amorphous in nature.

The deposition rate of germania depends on several parameters of the transport process, such as the geometry of the reaction tube, the pressure of the transport agent, the substrate temperature, the temperature gradient, among others. For example, when $5 \times 10^{-3}$ moles (a pressure of approximately 3.5 atmosphere at the operating temperature) of anhydrous hydrogen chloride was used in a reaction tube of 2.5 centimeters inside diameter and 15 centimeters length, and the quartz substrates and source material were maintained at 500° C. and 200° C., respectively, the deposition rate of germania was approximately 1 micron per hour. The deposition rate can be increased by increasing the pressure of the transport agent or increasing the temperature gradient within the tube.

The germania film deposited in the above-described manner is transparent and highly adherent to the substrate. Films having a thickness in the range of from several tenths of a micron to about 500 microns were satisfactorily grown.

Physical and chemical tests indicated the film was substantially of $GeO_2$. Using a mass spectrometric technique, the film was found to be homogeneous in composition containing about 1.5 atomic percent chlorine and 12 atomic percent silicon. Silicon in the film is in the form of silicon dioxide, or silica. Several relatively thick films, 300 microns or more, were separated from their substrates and analyzed by chemical and emission spectroscopic techniques. The chlorine and silicon contents of these films were found to be about 1 atomic percent and 10 atomic percent, respectively.

The concentration of chlorine can not be readily explained other than that it is frequently the case in transport phenomena that an element of the transport agent is incorporated in the product. The particular composition of the material may be accounted for by the presence of germanium oxychloride or germanium hydroxychloride in the resulting film.

Silica in the transport of germania is not due to a reaction of hydrogen chloride with the tube wall or quartz substrate since they are inert to hydrogen chloride under the conditions used. It is presumably formed by a reaction between germanium tetrachloride and silicon dioxide and the subsequent hydrolysis of the resulting silicon-containing chloride in the higher temperature region of the reaction tube. By using reaction tubes made from materials inert toward chemical species involved in the transport reaction, the inclusion of silica could be eliminated. Many metals, of which silver and platinum are examples, can serve this purpose. However, inclusion of silica in the germania film does not appear to detract from the applicability of the film in semiconductor technology.

The density of deposited germania films was found to be about 3.5 grams per cubic centimeter, comparable to that of germania obtained by the hydrolysis of germanium tetrachloride.

While the present invention has been shown and described in a few forms only, it will be apparent that various changes and modifications may be made without departing from the spirit and scope thereof.

What is claimed is:

1. In a method of forming a layer of germania on a substrate, the steps comprising: heating a germania source at a first temperature in an atmosphere containing at least one member of the group consisting of hydrogen chloride and hydrogen bromide; heating a substrate at a second temperature greater than said first temperature in said atmosphere to cause gaseous products from said germania source to be transported to said substrate and to form germania thereon.

2. In a method in accordance with claim 1, the steps set forth wherein: said first temperature is in the range from about 100° C. to about 300° C. and said second temperature is in the range from about 350° C. to about 700° C.

3. In a method in accordance with claim 1, the steps set forth wherein: said atmosphere contains a partial pressure of from about ½ atmosphere to about 10 atmospheres of said at least one member of the group consisting of hydrogen chloride and hydrogen bromide.

4. In a method of forming a layer of germania on a substrate, the steps comprising: placing a quantity of germania and a substrate in a reaction chamber; providing said reaction chamber with an atmosphere of at least one member of the group consisting of hydrogen chloride and hydrogen bromide; establishing a temperature gradient between said quantity of germania and said substrate with said quantity of germania being at a lower temperature than said substrate to cause transport of germania from said quantity of germania to said substrate.

5. In a method in accordance with claim 4, the steps set forth wherein: said quantity of germania is at a temperature of at least about 100° C., and said substrate is at a temperature of less than about 700° C.

6. In a method in accordance with claim 4, the steps set forth wherein: said substrate is a body of semiconductive material and the temperature of said substrate is sufficiently low that said substrate and said atmosphere are compatible.

7. A method of forming a dense, adherent layer of germania on a substrate comprising the steps of: placing in a chamber a germania source and a substrate with a spacing of from about 3 inches to about 5 inches therebetween; evacuating said chamber to a pressure at least as low about $10^{-5}$ Torr; introducing into said chamber a gas containing at least one member of the group consisting of hydrogen chloride and hydrogen bromide at a partial pressure of from about ½ atmosphere to about 10 atmospheres; sealing said chamber; placing said chamber in a furnace having two independently controlled temperature zones; heating said source to a temperature of from about 100° C. to about 200° C. and heating said substrate to a temperature of from about 400° C. to about 500° C.

8. A method of forming a dense, adherent layer of germania on a substrate comprising the steps of: placing in a chamber a germania source and a substrate with a spacing of from about 3 inches to about 5 inches therebetween, said chamber being a tubular member having two open ends; introducing into the open end of said chamber nearest said source a gas containing at least one member of the group consisting of hydrogen chloride and hydrogen bromide at about 1 atmosphere pressure while heating said source at a temperature of from about 100° C. to about 200° C. and heating said substrate to a temperature of from about 400° C. to about 500° C.

References Cited

UNITED STATES PATENTS 2,831,784 4/1958 Gastinger ---------- 117—106

ALFRED L. LEAVITT, *Primary Examiner.*

A. GOLIAN, *Assistant Examiner.*